(12) United States Patent
Grivna (10) Patent No.: US 7,462,550 B2
(45) Date of Patent: Dec. 9, 2008

(54) METHOD OF FORMING A TRENCH SEMICONDUCTOR DEVICE AND STRUCTURE THEREFOR

(75) Inventor: Gordon M. Grivna, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 543 days.

(21) Appl. No.: 11/256,409

(22) Filed: Oct. 24, 2005

(65) Prior Publication Data

US 2007/0093077 A1 Apr. 26, 2007

(51) Int. Cl.
*H01L 21/76* (2006.01)

(52) U.S. Cl. .................. 438/430; 438/432; 438/446; 257/E29.26

(58) Field of Classification Search ................ 438/270, 438/452, 589, 430, 432, 446; 257/E29.26
See application file for complete search history.

(56) References Cited

U.S. PATENT DOCUMENTS

| 4,967,245 A | 10/1990 | Cogan et al. | |
|---|---|---|---|
| 6,861,296 B2* | 3/2005 | Hurst et al. | 438/138 |
| 2003/0176043 A1* | 9/2003 | Kim et al. | 438/424 |

OTHER PUBLICATIONS

"Trench Power MOSFET Having Low Gate Charge", publication No. IPCOM000021950D, on Feb. 17, 2004, ip.com.

* cited by examiner

*Primary Examiner*—Quoc D Hoang
(74) *Attorney, Agent, or Firm*—Robert F. Hightower (57) ABSTRACT

In one embodiment, a trench semiconductor device is formed to have an oxide of a first thickness along the sidewalls of the trench, and to have a greater thickness along at least a portion of a bottom of the trench.

20 Claims, 5 Drawing Sheets

FIG. 9

METHOD OF FORMING A TRENCH SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods and structures to form semiconductor devices that utilized trenches that were lined with an insulator such as silicon dioxide. These lined trenches had various applications such as forming the gate insulator for metal oxide semiconductor (MOS) field effect transistors (FETs). One particular application was for forming the gate of power MOS transistors. Such MOS transistors were sometimes referred to as trench FETs or TFETs.

One method of forming the lined trenches used two different process steps to form the insulator. Silicon dioxide or oxide was formed on the bottom portion of the trench and subsequently an oxide was formed along the sidewalls of the trench. Forming the sidewall oxide subsequent to the bottom oxide exposed the critical trench sidewall to multiple process steps while forming the bottom oxide and caused increased stress at the sidewall to bottom oxide interface. The increased stress often caused sidewall oxide thinning at the interface.

Another method of forming the lined trenches simultaneously formed a thick oxide in the bottom of the trench and the top of the trench around the trench opening. The oxide near the trench opening was referred to as a corner oxide. An example of such a lined trench is disclosed in a publication entitled "Trench Power MOSFET Having Low Gate Charge", published article, website IP.com, IPCOM000021950D, Feb. 17, 2004. The thick oxide at the top of the trench narrowed the opening at the top of the trench and often made it difficult to form a conductive material within the trench. The oxide growth at the top of the trench also limited the thickness of the oxide that could be formed at the bottom of the trench.

Accordingly, it is desirable to have a lined trench and method that facilitates forming a thick oxide in the bottom of the trench, that protects sidewalls of the trench during subsequent processing steps, that reduces stress in the resulting device, that does not impede filling of the trench with conductive material, and that does not limit the thickness of the oxide in the bottom of the trench.

For simplicity and clarity of illustration, elements in the figures are not necessarily to scale, and the same reference numbers in different figures denote the same elements. Additionally, descriptions and details of well-known steps and elements are omitted for simplicity of the description. Although the devices may be explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
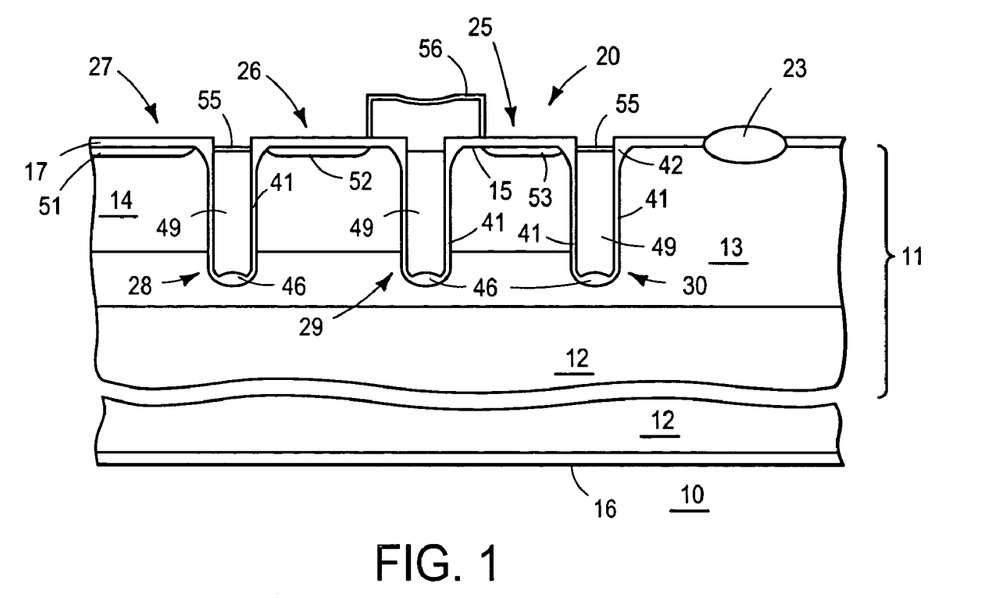
FIG. 1 illustrates an enlarged cross-sectional portion of an embodiment of a portion of a semiconductor device in accordance with the present invention.

FIG. 1 illustrates an enlarged cross-sectional view of a portion of an exemplary embodiment of a semiconductor device 10 that utilizes an oxide lined trench, such as trenches 28, 29, and 30. Trenches 28, 29, and 30 are pointed out in a general way by arrows. Device 10 is formed on a semiconductor substrate 11 that has a first surface or top surface 15. Trenches 28, 29, and 30 are formed to have an oxide 41 that has a first thickness along the sidewalls of trenches 28, 29, and 30 and an oxide 46 that has a second thickness, that is greater than the first thickness, along the bottom portion of trenches 28, 29, and 30. The thickness of oxide 41 on the sidewalls remains substantially the same thickness during the formation of oxide 46 and is much thinner than the thickness of oxide 46 on the bottom. Additionally, the sidewalls of trenches 28-30 form an angle of greater than ninety degrees with surface 15 near the opening of trenches 28-30. For the exemplary embodiment illustrated in FIG. 1, trenches 28, 29, and 30 are utilized to form a vertical power MOSFET having a plurality of interconnected vertical power MOSFET cells such as transistors 25, 26, and 27. Power MOSFETs having a plurality of interconnected cells are well known to those skilled in the art. Transistors 25, 26, and 27 are identified in a general way by arrows. In other embodiments, any of trenches 28-30 may be used as a portion of an individual transistor or other type of semiconductor device.

Figure 2:
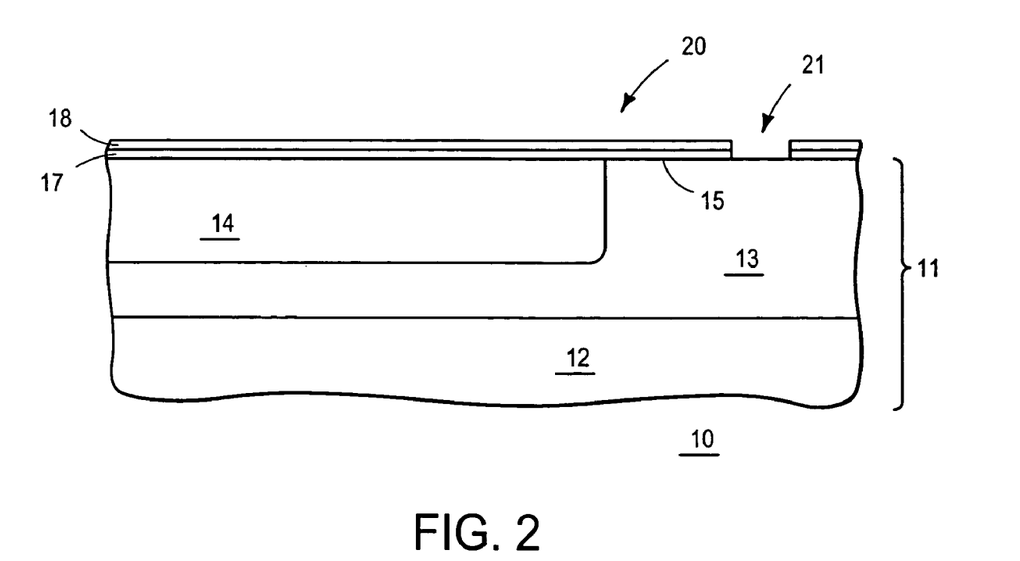
FIG. 2 illustrates an enlarged cross-sectional portion of the semiconductor device of FIG. 1 illustrating portions of an early stage of an embodiment of a method of forming the semiconductor device FIG. 1 in accordance with the present invention.

FIG. 2 illustrates an enlarged cross-sectional portion of device 10 illustrating portions of an early stage of an embodiment of a method of forming device 10. This description has references to both FIG. 1 and FIG. 2. Substrate 11 generally includes a bulk semiconductor substrate 12 that has an epitaxial layer 13 formed on one surface of substrate 12. However, in some embodiments epitaxial layer 13 may not be required and device 10 may be formed on bulk semiconductor substrate 12. In such a case, surface 15 would be the top surface of substrate 12. A portion of surface 15 may be doped to form a doped region 14 within substrate 11. In the preferred embodiment, bulk substrate 12 is heavily doped N-type, layer 13 is lightly doped N-type, and region 14 is P-type. A region 20 of substrate 11 is used for forming transistors, such as transistors 25, 26, and 27, and other active and passive elements. Other regions of substrate 11 may be used for other types of devices.

A first isolating layer 17, typically silicon dioxide, is formed on surface 15 of substrate 11. A first protective layer 18 is formed on layer 17. As will be seen further hereinafter, protective layer 18 is used to assist in forming oxides 41 and 46 and may assist in ensuring that the opening of trenches 28-30 near surface 15 is equal to or wider than the width of trenches 28-30 distal from the opening. Such a configuration facilitates subsequently forming conductor material within trenches 28-30. The material used for layer 18 is a material that restricts oxygen diffusion and therefore restricts oxidation of any layers under layer 18. Although layer 18 is shown as a single layer of material it can also be a layered structure of different material types. Layers 17 and 18 preferably are silicon dioxide and a stack of silicon oxide over silicon nitride, respectively. A mask, not shown, generally is applied to layer 18 and an opening 21 is formed through layer 18 and oxide 17 to expose a portion of surface 15 within region 21. Opening 21 will subsequently be utilized to form a field oxide region as will be seen further hereinafter.

Figure 3:
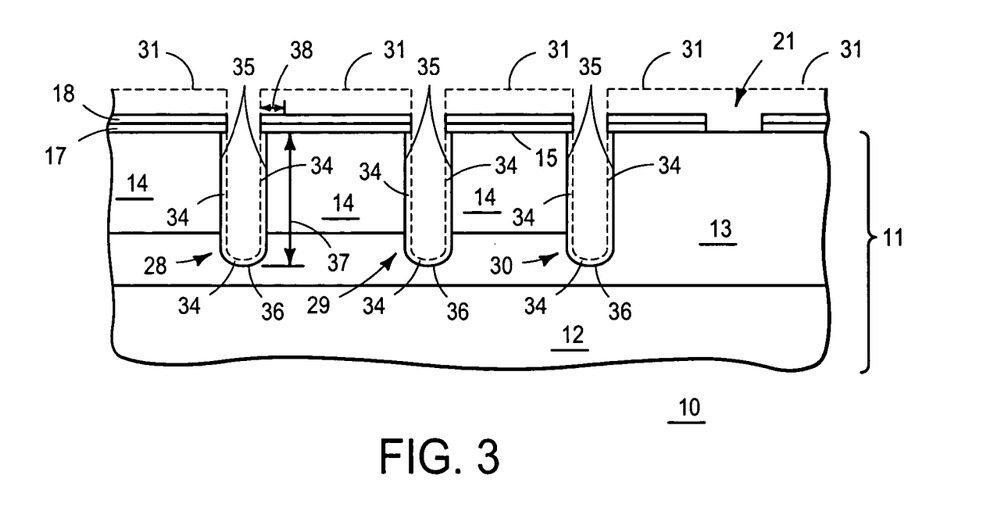
FIG. 3-FIG. 9 illustrate enlarged cross-sectional portions of the semiconductor device of FIG. 1 illustrating portions of subsequent stages according to an embodiment of a method of forming the semiconductor device of FIG. 1 in accordance with the present invention.

FIG. 3 illustrates an enlarged cross-sectional view of a portion of device 10 at a subsequent stage of an embodiment of a method of forming semiconductor device 10. A mask 31, illustrated by dashed lines, is applied to layer 18 and patterned to have openings where trenches 28, 29, and 30 are to be formed. The openings in mask 31 are utilized to form openings through layer 18, through layer 17, and a first depth 37 into substrate 11 thereby forming openings in substrate 11 for trenches 28, 29, and 30. As is well known in the art, the chemistries used to etch layers 18 and then 17 are usually different from the chemistries used to etch substrate 11. In the preferred embodiment, an anisotropic fluorine based RIE type of etch is used to etch layers 17 and 18. The openings within substrate 11 for trenches 28, 29, 30 may be formed by a variety of well-known techniques such as reactive ion etching (RIE) typically with chlorine or bromine chemistry or fluorine based techniques such as the Bosch process. In the preferred embodiment, depth 37 is greater than the depth of region 14. For embodiments without region 14, depth 37 may be different. Mask 31 is removed.

The openings within substrate 11 generally have sidewalls 35 aligned with the edges of the opening through layers 17 and 18. This position of sidewalls 35 is illustrated by dashed lines within trenches 28-30. Sidewalls 35 are then oxidized to form an oxide 34 extending from the dashed lines into the silicon of sidewalls 35 and bottom 36.

Figure 4:
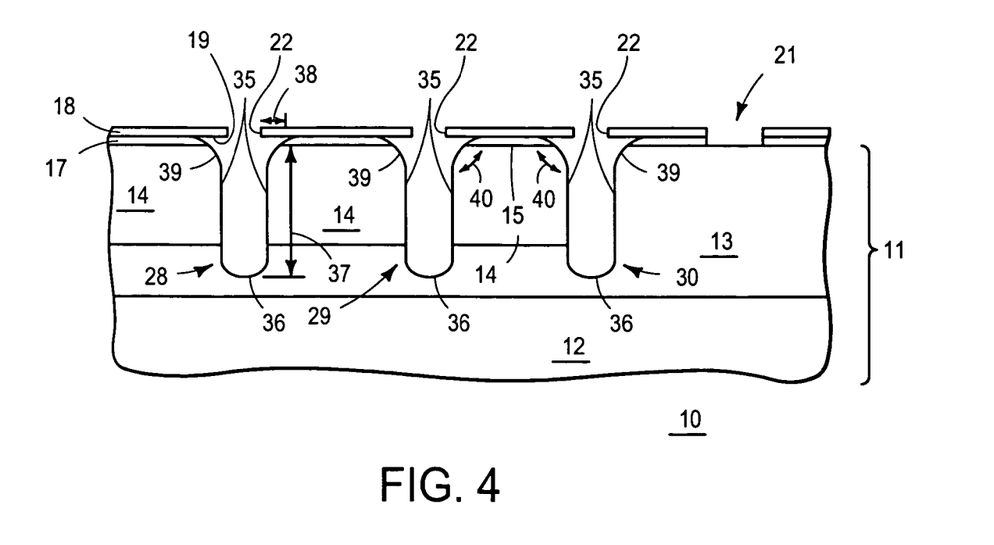

FIG. 4 illustrates an enlarged cross-sectional view of a portion of device 10 at another subsequent stage of an embodiment of a method of forming semiconductor device 10. Oxide 34 is removed from sidewalls 35 and bottom 36 thereby causing sidewalls 35 to be pulled-back or recessed under layer 18. The amount of the pull-back or recess usually is determined by the thickness of oxide 34 and the amount of oxide 34 that is removed. In the preferred embodiment, oxide 34 is formed to a thickness of about one hundred (100) nanometers and all of oxide 34 is removed resulting in sidewalls 35 being pulled-back approximately one-half of the thickness of oxide 34. During the removal of oxide 34 from sidewalls 35, a portion of layer 17 is also removed from under layer 18 and adjacent to the opening through layer 18. Typically, the process to remove oxide 34 is preferential to oxide and follows the portion of layer 17 that is abutting oxide 34 and even extends a distance 38 under layer 17. Distance 38 generally is greater than the thickness of oxide 34 and may be about one hundred (100) to one thousand (1000) nanometers, and preferably about one hundred fifty (150) nanometers.

Removing the portion of layer 17 also removes a portion of sidewalls 35 near surface 15 forming a portion of sidewalls 35 into a portion of shoulders 39 near or adjacent to and especially at the interface of sidewalls 35 and surface 15. Shoulders 39 form a non-orthogonal intersection with surface 15 and a resulting interior angle 40 that generally is greater than ninety degrees. The removal of the portion of layer 17 underlying layer 18 leaves a portion of layer 18 over-hanging the opening of trenches 28-30 as a ledge 22. Ledge 22 extends past sidewalls 35 and exposes an under surface or bottom surface 19 of layer 18. The undercutting of layer 18 also forms the opening of trenches 28, 29, and 30 at surface 15 to be wider than the width of trenches 28, 29, and 30 along sidewalls 35 distal to the opening. Forming shoulders 39 assists in providing the wide opening near surface 15 which facilitates forming the remaining elements of trenches 28-30 including subsequently filling trenches 28-30 with a conductor material. The length of shoulders 39 from surface 19 to sidewalls 35 generally is about one hundred fifty (150) nanometers. Removing a portion of sidewalls 35 also assists in formation of protective spacers at a later portion of the processing.

Thus, as seen in the description of FIG. 3 and FIG. 4, the openings of trenches 28-30 are enlarged and deepened to position sidewalls 35 underlying layer 18 and spaced away from the edge of the opening through layer 18. This process also forms shoulders at the top portion of sidewalls 35 forming the opening of trenches 28-30 to be wider than the width distal from surface 15. In other embodiments, the width of trenches 28-30 may be increased to extend underlying layer 17 and forming shoulder 39 by other techniques such as removing a portion of sidewalls 35 through an isotropic silicon etch (either wet or dry). Forming shoulders 39 also assists in providing a low stress area for subsequent conformal oxide growth along the top edge of trenches 28-30.

Figure 5:
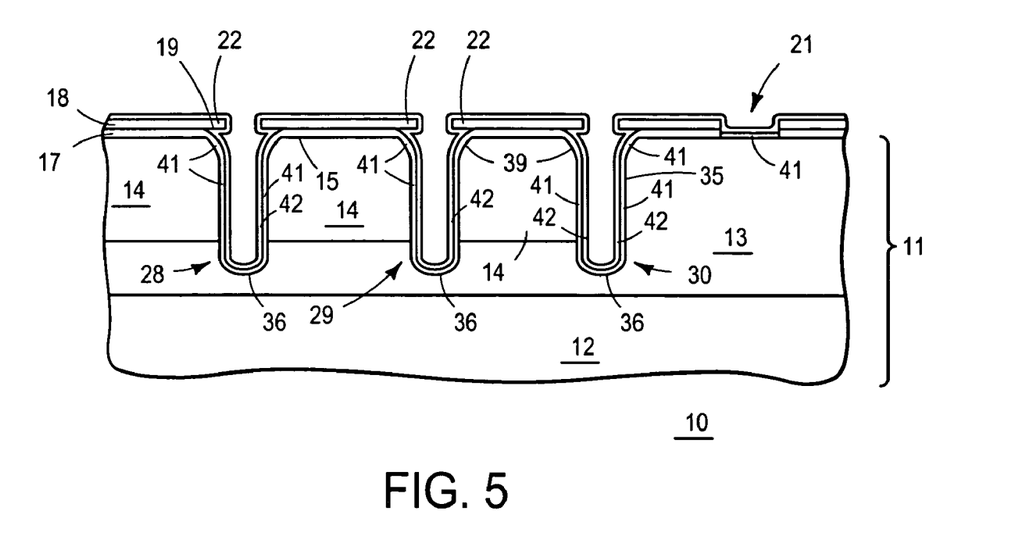

FIG. 5 illustrates an enlarged cross-sectional view of a portion of device 10 at another subsequent stage of an embodiment of a method of forming semiconductor device 10. A first silicon dioxide layer or oxide 41 is formed along sidewalls 35, including shoulders 39, and bottom 36. Oxide 41 typically extends from bottom surface 19 of layer 18 along shoulders 39, sidewalls 35, and across bottom 36. Shoulders 39 assist in providing a low stress area for forming oxide 41 along shoulders 39, thus, at the top edge of trenches 28-30. In the preferred embodiment, a first portion of oxide 41 that is formed along sidewalls 35 will function as a gate oxide for vertical transistors 25, 26, and 27. Consequently, the thickness of oxide 41 is small, typically between about fifty (50) and one hundred (100) nanometers and preferably about fifty five (55) nanometers. Due to the curved shape of shoulders 39, the portion of oxide 41 on shoulder 39 and near to surface 15 also has a curved shape and substantially equivalent thickness to the oxide on surface 15. Oxide 41 may be formed by a variety of well-known techniques including dry oxidation or wet oxidation. In order to assist in subsequently forming thick oxide 46 without substantially increasing the stress or changing the thickness of oxide 41 along sidewalls 35, a polysilicon layer 42 is formed on oxide 41 including forming polysilicon layer 42 overlying shoulders 39, sidewalls 35, and bottom 36. In the preferred embodiment a conformal layer of polysilicon is formed on layer 18 including on the edges of the opening through layer 18, on surface 19, and on oxide 41. Polysilicon layer 42 generally is formed to have a thickness of about twenty (20) to one hundred (100) nanometers and preferably is deposited to a thickness of about fifty (50) nanometers.

Figure 6:
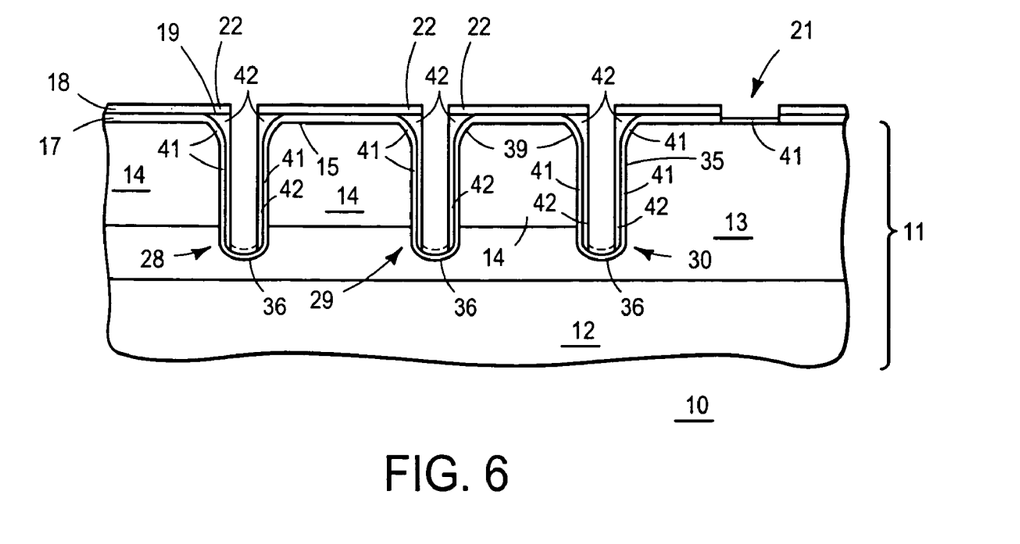

FIG. 6 illustrates an enlarged cross-sectional view of a portion of device 10 at another subsequent stage of an embodiment of a method of forming semiconductor device 10. Thereafter, the non-vertical portion of layer 42 overlying protective layer 18, the portion on the edges of ledge 22, and on bottom 36 are removed to expose at least a portion of oxide 41 along bottom 36. An amount of layer 42 is removed to ensure that the portion of layer 42 on sidewalls 35 and shoulders 39 extend away from oxide 41 no greater than the edge of ledge 22. As illustrated in FIG. 6, layer 42 remains on the portion of oxide 41 underlying ledge 22 thereby covering all of oxide 41 except the portion on bottom 36. Dashed lines illustrate the portion of layer 42 that is removed from bottom 36. Generally, the portion of layer 42 is removed by an anisotropic reactive ion etch that leaves layer 42 on the portion of oxide 41 that is on sidewalls 35 including shoulders 39.

Figure 7:
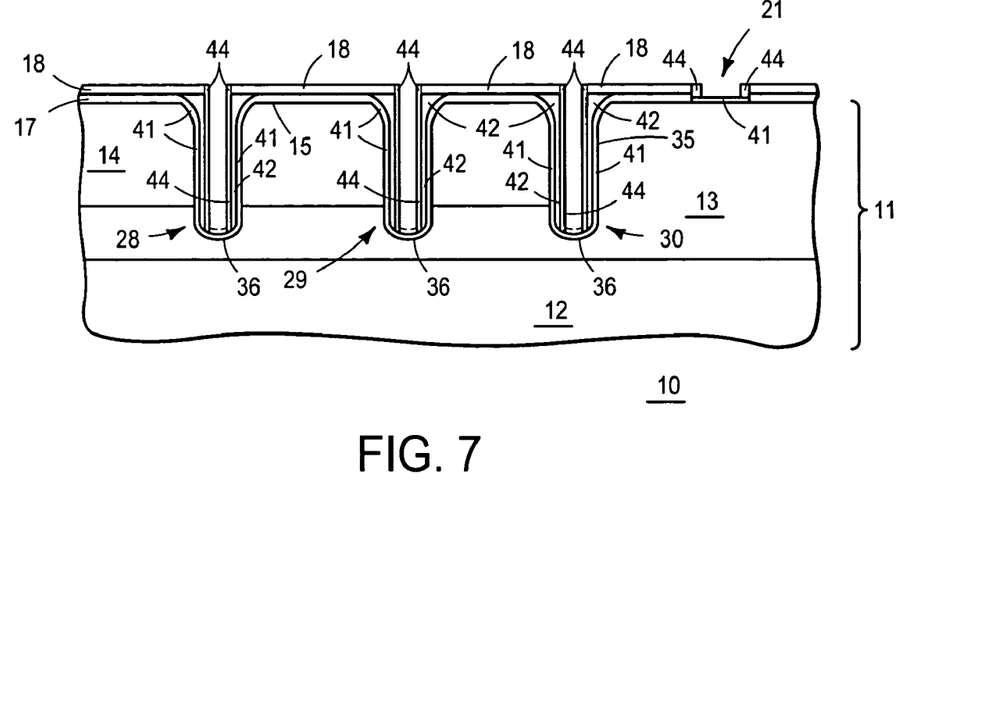

FIG. 7 illustrates an enlarged cross-sectional view of a portion of device 10 at another subsequent stage of an embodiment of a method of forming semiconductor device 10. A second protective layer 44 is formed on layer 42 and the exposed portion of oxide 41 along bottom 36. Layer 44 generally is formed from the same material as layer 18. A line illustrates the transition between layer 18 and layer 44. Recessing layer 42 below the sidewall of ledge 22 forms a substantially flat surface of layer 18 that is void of layer 42 on which to form layer 44. Without the step of recessing layer 42 under ledge 22, layer 44 would not be formed on the sidewall of layer 18 and the exposed portion of layer 44 and the top portion of oxide 41 would be exposed to subsequent processing operations. The non-vertical portions of layer 44 are removed to expose at least a portion of oxide 41 along bottom 36. The removed portions of layer 44 are illustrated by dashed lines. The portions of layer 44 may be removed by operations generally referred to as anisotropic spacer etch. The portions of layer 44 are removed by an RIE etch that is timed to ensure that all of the non-vertical portions of layer 44 overlying bottom 36 are removed. In the preferred embodiment, the etch to remove the portions of layer 44 is timed to remove approximately fifty percent more material than is expected to be along bottom 36. For example, if layer 44 is formed to a thickness of about 50 nanometers, the removal etch is timed to remove about 75 nanometers.

Figure 8:
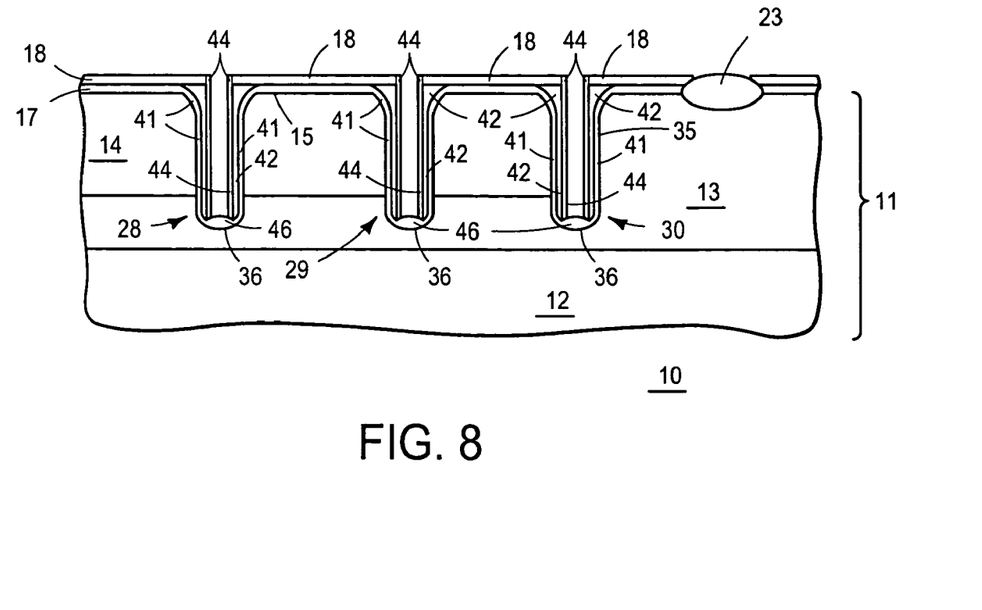

FIG. 8 illustrates an enlarged cross-sectional view of a portion of device 10 at another subsequent stage of an embodiment of a method of forming semiconductor device 10. The thickness of oxide 41 along a portion of bottom 36 is increased to a second thickness to form a thick oxide 46 in the bottom of trenches 28-30. The second thickness of thick oxide 46 is formed without substantially increasing or changing the first thickness of oxide 41 that is along sidewalls 35 including along shoulders 39 and layer 17 along surface 15. Oxide 46 is formed by further oxidation of the material exposed within trenches 28-30. The remaining portions of layers 18 and 44 protect oxide 41 that is on surface 15 and sidewalls 35, including on shoulders 39, so that the first thickness of oxide 41, in addition to the thickness of layer 17, is not substantially changed during the formation of thick oxide 46. The goal is to not change the first thickness, however, those skilled in the art realize there are always minor variances, such as process variations, such that some minor oxidation may occur that prevent keeping the thickness exactly constant. Those skilled in the art also realize that oxide will also grow in any other openings in protective layer 18 to form field oxide isolation areas. In the preferred embodiment, a wet oxidation with a hydrogen source is used to increase the thickness of the exposed portions of oxide 41 to form oxide 46. In the preferred embodiment, the thickness generally is increased by approximately two hundred nanometers to a total thickness of approximately two hundred thirty (230) nanometers, but may be increased more or less in other embodiments. In this preferred embodiment, the wet oxidation is performed at approximately one thousand (1000) degrees Celsius. Forming protective layer 44 and layer 42 covering oxide 41 along sidewalls 35, including shoulders 39, functions like a poly buffered locos that facilitates forming oxide 46 very thick without creating stresses or dislocations at the bottom of trenches 28-30. Layers 42 and 44 also protect oxide 41 from contaminants and etchants during subsequent operations. During the formation of thick oxide 46, a field oxide 23 may be formed in opening 21.

Figure 9:
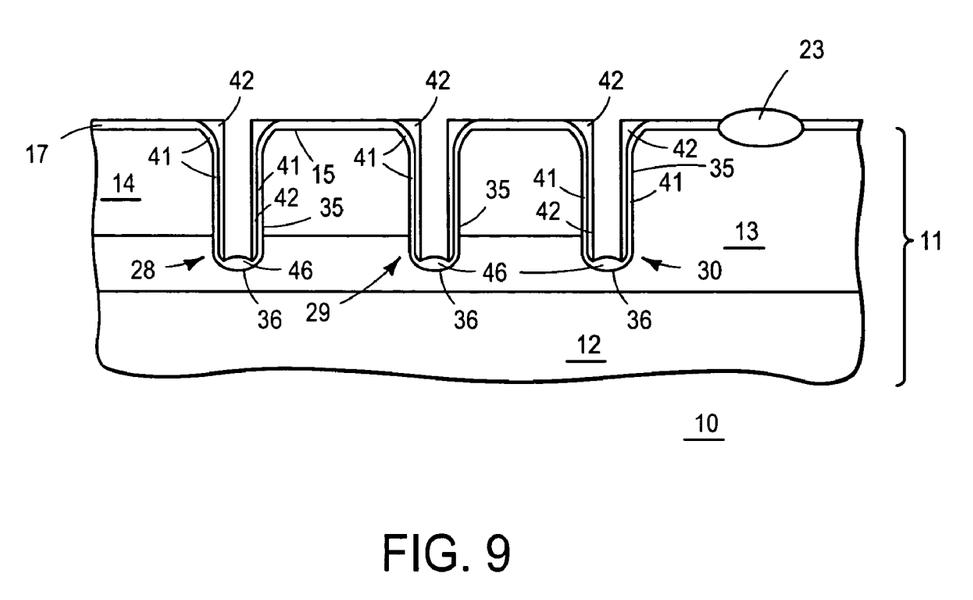

FIG. 9 illustrates an enlarged cross-sectional view of a portion of device 10 at another subsequent stage of an embodiment of a method of forming semiconductor device 10. Layers 18 and 44 are removed leaving layer 42 to protect oxide 41. Layers 18 and 44 may be removed by a variety of well-known techniques and preferably are removed by a wet nitride stripping operation such as hot phosphoric acid.

Referring back to FIG. 1, a conductor material is formed within the remaining opening within trenches 28-30. The conductor material may be a variety of well know conductor materials including polysilicon, WSi, W, or combinations of conductive materials. In the preferred embodiment, a blanket layer of phosphorus doped polysilicon 49 is formed overlying layer 17 and filling the remainder of the openings within trenches 28-32. The portion of polysilicon 49 within trenches 28-30 contacts layer 42, thus, layer 42 is illustrated as a portion of polysilicon 49. Thereafter, a mask is applied and portions of polysilicon 49 on layer 17 is removed from layer 17 leaving a portion of polysilicon 49 within trenches 28-30 to function as the gate of transistors 25-27. Typically, the portion of polysilicon 49 on layer 17 is removed and a portion of the polysilicon within trenches 28-30 is removed so that the upper surface of polysilicon 49 within trenches 28-30 is below the top surface of layer 17. However, as illustrated by trench 29, polysilicon 49 may extend out of the trench and overlie the surface of layer 17. This type of structure generally is used to make electrical contact to all of the gates of the plurality of transistor cells of a multi-cell power MOSFET. Forming the layer 46 without substantially changing the thickness of oxide 41 along sidewalls 35, assists in ensuring that the opening of trenches 28-30 are wide enough to allow polysilicon 49 to fill trenches 28-30. Not closing the opening of trenches 28-30, such as by oxidizing the top portion of the trenches, facilitates forming polysilicon 49 filling trenches 28-30.

Typically, an oxide layer 55 is formed on the surface of polysilicon 49 within trenches 28 and 30, and an oxide layer 56 is formed on polysilicon 49 that is extending out of trench 29. Those skilled in the art will appreciate that during the process of growing layer 55 a portion of polysilicon 49 and a portion of layer 13 that is adjacent to layer 55 may also be oxidized thereby increasing the thickness of oxide 41 in those regions. The depth to which this extra oxidation extends oxide 41 into layer 13 and into polysilicon 49 dependents upon how far layer 49 is recessed below surface 17 and the thickness of oxide layer 55.

Thereafter, processing usually is continued to form transistors, such as transistors 25-27, or other active elements or passive elements on substrate 11. In the exemplary embodiment illustrated in FIG. 1, doped regions 51, 52, and 53 may be formed on surface 15 and extending into substrate 11 adjacent to oxide 41 in order to form source regions for transistors 25-27. Thereafter, openings may be formed through layer 17 to make electrical contact to doped regions 51-53 in addition to region 14. In the preferred embodiment, a drain electrode 16 is formed on a second surface of substrate 11 to form a drain contact for device 10.

In view of all of the above, it is evident that a novel device and method is disclosed. Included, among other features, is forming an oxide along sidewalls of a trench to have a first thickness including along the sidewalls near the trench opening, and to have a greater thickness along the bottom of the trench. Keeping the thickness substantially constant along the sidewalls results in a wider opening that facilitates forming a conductor material within the trench. Keeping the thickness substantially constant along the sidewalls also facilitates forming a protective layer to protect the oxide during subsequent processing operations.

While the subject matter of the invention is described with specific preferred embodiments, it is evident that many alternatives and variations will be apparent to those skilled in the semiconductor arts. Those of average skill in the art will appreciate that the illustrated steps are exemplary only and constitute only a portion of the process steps required to form device 10 on semiconductor substrate 11. Additionally, those skilled in the art will appreciate that layer 42 may be omitted. In such a case, layer 44 would fill the space under ledge 22 instead of layer 42.

The invention claimed is:

1. A method of forming a trench semiconductor device comprising:
   providing a semiconductor substrate having a first surface;
   forming a first opening from the first surface into the semiconductor substrate wherein the first opening has sidewalls and a bottom;
   forming a first silicon dioxide layer on the sidewalls and on the bottom of the first opening to a first thickness;
   forming a semiconductor material on at least a first portion of the first silicon dioxide layer that is on the sidewalls;
   increasing the first thickness of a portion of the first silicon dioxide layer along the bottom to a second thickness without substantially increasing the first thickness of the first silicon dioxide layer on the sidewalls wherein the second thickness is greater than the first thickness; and
   leaving at least a portion of the semiconductor material on the first portion of the silicon dioxide.

2. The method of claim 1 wherein forming the first opening includes forming a second silicon dioxide layer on the first surface, forming a protection layer on the second silicon dioxide layer, and forming the first opening through the protection layer and through the second silicon dioxide layer.

3. The method of claim 2 wherein forming the first portion of the sidewalls includes undercutting the protection layer a first distance with a portion of the sidewalls extending to underlie the protection layer.

4. The method of claim 1 wherein forming the first silicon dioxide layer on the sidewalls and on the bottom of the first opening includes oxidizing the sidewalls and the bottom to form the first silicon dioxide layer to the first thickness.

5. The method of claim 4 wherein increasing the first thickness of the portion of the first silicon dioxide layer on the bottom to the second thickness includes subsequently oxidizing the portion of the first silicon dioxide layer on the bottom to form the second thickness without oxidizing the first silicon dioxide layer on the sidewalls and without oxidizing the semiconductor material.

6. The method of claim 4 wherein increasing the first thickness of the portion of the first silicon dioxide layer on the bottom to the second thickness includes forming a protection layer overlying the first silicon dioxide layer and the semiconductor material, removing a portion of the protection layer in the bottom of the first opening and overlying the portion of the first silicon dioxide layer along the bottom but not removing the protection layer that is overlying the first silicon dioxide layer that is on the sidewalls and that is also overlying the semiconductor material, and subsequently oxidizing the portion of the first silicon dioxide layer along the bottom.

7. The method of claim 6 wherein forming the protection layer overlying the first silicon dioxide layer includes forming a silicon nitride layer overlying the first silicon dioxide layer.

8. The method of claim 6 further including forming the semiconductor material as a polysilicon layer on the first silicon dioxide layer and forming the protection layer on the polysilicon layer.

9. The method of claim 1 further including forming a protective layer overlying the first silicon dioxide layer and the semiconductor material, and removing a portion of the protective layer that is overlying the bottom of the opening prior to the step of increasing the first thickness.

10. The method of claim 9 wherein forming the semiconductor material includes forming polysilicon on at least the first portion of the first silicon dioxide layer.

11. A method of forming a trench semiconductor device comprising:
    providing a semiconductor substrate having a first surface;
    forming a first opening from the first surface into the semiconductor substrate wherein the first opening has sidewalls and a bottom;
    forming a first silicon dioxide layer on the sidewalls and on the bottom to a first thickness;
    forming a first polysilicon layer on the first silicon dioxide layer on the sidewalls but not on at least a first portion of the first silicon dioxide layer that is on the bottom; and
    increasing the first thickness of the first portion of the first silicon dioxide layer to a second thickness without substantially increasing the first thickness of the first silicon dioxide layer on the sidewalls wherein the second thickness is greater than the first thickness.

12. The method of claim 11 wherein forming the first silicon dioxide layer on the sidewalls includes forming a second portion of the first silicon dioxide layer near an intersection with the first surface to have a curved shape.

13. The method of claim 12 wherein forming the first opening from the first surface into the semiconductor substrate includes forming a portion of the sidewalls of the first opening to have substantially the curved shape near the first surface.

14. The method of claim 12 wherein increasing the first thickness of the first portion of the first silicon dioxide layer to the second thickness includes forming a protection layer on the first polysilicon layer that is on the sidewalls including on the first polysilicon layer overlying the curved shape, removing a portion of the first polysilicon layer that is on the bottom to expose the first portion of the first silicon dioxide layer, and oxidizing the first portion of the first silicon dioxide layer without oxidizing the first silicon dioxide layer on the sidewalls including on the curved shape.

15. The method of claim 11 wherein forming the first opening from the first surface into the semiconductor substrate includes forming a second silicon dioxide layer on the first surface, forming a protection layer on the second silicon dioxide layer, and forming the first opening through the protection layer and through the second silicon dioxide layer and undercutting the protection layer a first distance to form a portion of the sidewalls with a curved shape.

16. The method of claim 15 wherein undercutting the protection layer the first distance includes removing a portion of the semiconductor substrate near an intersection of the sidewalls and the first surface.

17. The method of claim 15 wherein forming the first silicon dioxide layer on the sidewalls includes forming the first silicon dioxide layer on the sidewalls including on the portion having the curved shape.

18. The method of claim 11 wherein forming the first silicon dioxide layer on the sidewalls includes forming a second portion of the first silicon dioxide layer near an intersection with the first surface to form an angle greater than ninety degrees with the first surface.

19. A trench semiconductor device comprising:
    a semiconductor substrate having a first surface;
    an opening extending into the semiconductor substrate from the first surface, the opening having sidewalls and a bottom;

a first silicon dioxide layer formed to a first thickness on sidewalls of the opening and formed to a second thickness on the bottom of the opening wherein the second thickness is greater than the first thickness, a first portion of the first silicon dioxide layer that is adjacent to the first surface forming a non-orthogonal angle with the plane of the first surface; and a polysilicon layer on the first portion of the silicon dioxide layer wherein the polysilicon layer has a sidewall that forms an angle of approximately ninety degrees with the plane of the first surface and wherein the sidewall of the polysilicon layer is substantially parallel to a second portion of the silicon dioxide layer that is away from the first surface and that does not intersect the plane of the first surface.

20. The trench semiconductor device of claim 19 wherein the first portion of the first silicon dioxide layer has substantially the first thickness.

* * * * *